United States Patent
Lee et al.

(10) Patent No.: US 7,713,762 B2
(45) Date of Patent: May 11, 2010

(54) TESTING THE QUALITY OF LIFT-OFF PROCESSES IN WAFER FABRICATION

(75) Inventors: Edward Hin Pong Lee, San Jose, CA (US); Jennifer Ai-Ming Leung, Fremont, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 174 days.

(21) Appl. No.: 11/957,483

(22) Filed: Dec. 17, 2007

(65) Prior Publication Data

US 2009/0152542 A1  Jun. 18, 2009

(51) Int. Cl.
*G01R 31/26* (2006.01)
*H01L 21/66* (2006.01)

(52) U.S. Cl. .............. 438/14; 438/15; 438/17; 438/18; 257/E21.521

(58) Field of Classification Search .......... 438/14, 438/15, 17, 18; 257/E21.521
See application file for complete search history.

(56) References Cited

U.S. PATENT DOCUMENTS

| | | | |
|---|---|---|---|
| 6,037,607 A | 3/2000 | Hause et al. | |
| 6,448,805 B1 * | 9/2002 | Heald et al. | 324/767 |
| 6,779,249 B2 | 8/2004 | Santini | |

* cited by examiner

*Primary Examiner*—Hsien-ming Lee
(74) *Attorney, Agent, or Firm*—Duft Bornsen & Fishman, LLP

(57) ABSTRACT

Test methods and components are disclosed for testing the quality of lift-off processes in wafer fabrication. A wafer is populated with one or more test components along with the functional components. These test components are fabricated with holes in an insulation layer that is deposited between conductive layers, where the holes were created by the same or similar lift-off process that is used to fabricate the functional components on the wafer. The test components may then be measured in order to determine the quality of the holes created by the lift-off process. The quality of the lift-off process used to fabricate the functional components may then be determined based on the quality of the holes in the test components.

20 Claims, 9 Drawing Sheets

TESTING THE QUALITY OF LIFT-OFF PROCESSES IN WAFER FABRICATION

BACKGROUND OF THE INVENTION

1. Field of the Invention

The invention is related to the field of wafer fabrication and, in particular, to testing the quality of lift-off processes used in wafer fabrication.

2. Statement of the Problem

Wafer fabrication is a procedure composed of many repeated sequential processes to produce electrical circuits, devices, chips, etc. For example, wafer fabrication is typically used to build semiconductor components, such as amplifiers or transistors. Wafer fabrication is also used to build magnetic recording or magnetic memory devices, such as magnetoresistance (MR) read elements, write elements, etc. The electrical circuits, devices, chips, etc, that are formed on a wafer are referred to herein as functional components.

Photolithography is often used in the wafer processes to pattern or shape thin films. Thin films may be patterned by either etching or lift-off processes. For the etching process, one or more thin-films are deposited on the wafer before the photoresists are defined. The photolithographic process is then performed to define the photoresists on top of the thin-films. The photoresists are patterned to protect the portions of the thin-films underneath the photoresists. An etching process is then performed to remove the areas of the thin-films that are not covered by the photoresists. The etching process may comprise a liquid or plasma chemical agent that removes the areas that are not protected by the photoresist. Etching can also be performed by physical bombardment with ions. After a photoresist is no longer needed, the photoresist may be removed. The photoresist may be removed with a liquid solution, or may be removed with a reactive ion etching process.

For the lift-off process, the photoresists are defined on the wafer before the thin films are deposited. The photolithographic process is performed to define the photoresists on top of the wafer. The photoresists are patterned to remove the portions of the thin-films that are subsequently deposited on top of the photoresists. One or more thin films are then deposited, which cover the photoresists and the exposed portions of the wafer. A lift-off process is then performed to remove the areas of the thin-films that are deposited on the photoresists. For the lift-off process, the photoresists are dissolved with a resist solvent. When the photoresists are removed, the areas of the thin-films that are deposited on the photoresists are washed away leaving holes in the thin-films.

One problem encountered in wafer fabrication is determining the quality of a lift-off process. If the lift-off process is poor, then the thin-films will not be removed in the areas where a hole is supposed to be. A poorly-formed hole may be caused for a number of reasons. For instance, the thin-films may be too thick, a photoresist may be too thin, or an undercut may be formed in the photoresist to avoid deposition fencing. In these scenarios, the thin-films may cover the top of the photoresist and the sides of the photoresist, and the lift-off solution will not be able to dissolve the photoresist wholly or even partially. If the photoresist cannot be dissolved, then the thin-films deposited on top of the photoresist will not be removed resulting in a poorly-formed hole.

Presently, when a lift-off process is performed on a wafer, the wafer is visually inspected with a microscope to determine if the holes in the thin-films were adequately formed. If one or more of the holes are poorly formed, then the lift-off process needs to be adjusted. This method of inspection may be inadequate especially when the areas of lift-off get smaller and the number of sites becomes numerous, because it is harder to visually determine whether the holes are open and adequately formed. It is therefore desirable to have alternative ways of determining the quality of a lift-off process in wafer fabrication.

SUMMARY OF THE SOLUTION

Embodiments of the invention solve the above and other related problems with test components that are fabricated on a wafer along with the functional components. Part of the process of fabricating the test components includes performing one or more lift-off processes, much like is performed in fabricating the functional components, to form holes in the test components. The test components are further fabricated in a manner that allows for electrical testing of the holes created by the lift-off process. The electrical testing in the test component on the wafer advantageously allows fabricators to determine the quality of the lift-off process used to fabricate the functional components. The electrical testing as described herein is more accurate and more efficient than the visual inspections presently performed.

One embodiment of the invention comprises a method of determining the quality of the lift-off process. For the method, one or more test components are fabricated on a wafer along with the functional components. The test components are fabricated with a lift-off process to define one or more holes in an insulation layer that is deposited between conductive layers. A resistance is then measured between the conductive layers in the holes of test components. If clean holes are formed with the lift-off process, then the conductive layers will be in good electrical contact exhibiting a low resistance. Conversely, if one or more of the holes are poorly-formed, then the conductive layers will not be in good electrical contact creating a higher resistance. The quality of the lift-off process used to fabricate the functional components on the wafer may then be determined based on the measured resistance in the test components.

Another embodiment of the invention comprises a method of fabricating test components on the wafer concurrently with functional components. For this method, a first conductive layer is patterned in a test component. Resists are then formed on the first conductive layer in lift-off locations, and an insulation layer is deposited. A lift-off process is then performed to remove the insulation layer on top of the resists to form holes in the insulation layer corresponding with the lift-off locations. Conductive material for a second conductive layer is then deposited to fill the holes in the insulation layer. The second conductive layer is then patterned to form traces connecting the filled holes in series, which defines a test circuit in the test component. The test circuit may then be measured to determine the quality of the lift-off process used to fabricate the functional components.

The invention may include other exemplary embodiments described below.

DESCRIPTION OF THE DRAWINGS

The same reference number represents the same element or same type of element on all drawings.

DETAILED DESCRIPTION OF THE INVENTION

Figure 1:
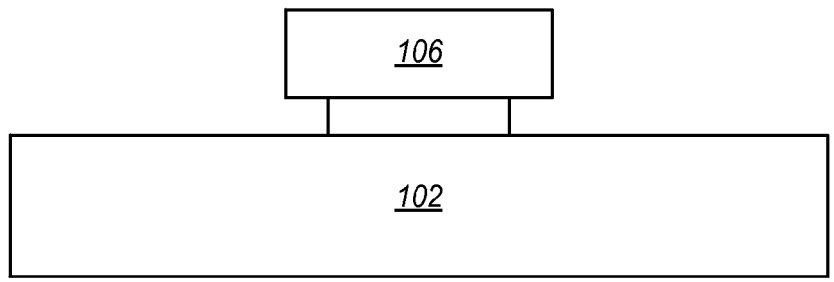
FIG. 1 is a cross-sectional view of a wafer with a photoresist formed on a conductive layer.
Figure 2:
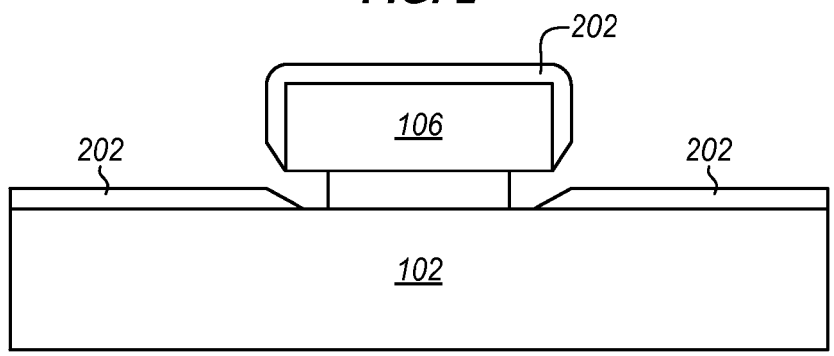
FIG. 2 is a cross-sectional view of the wafer with an insulation layer deposited on the photoresist.
Figure 3:
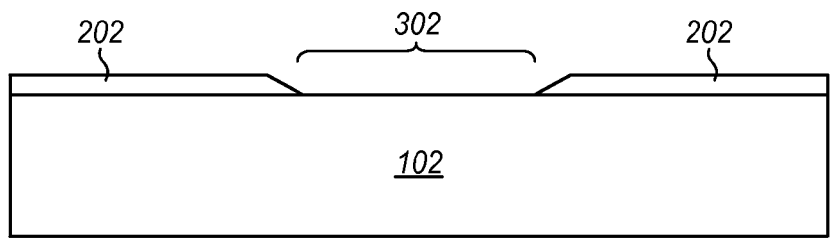
FIG. 3 is a cross-sectional view of the wafer with the photoresist removed.

FIGS. 1-3 illustrate an example of a typical lift-off process performed during wafer fabrication. To perform a lift-off process, a photoresist is patterned on a wafer. In this example, the photoresist is patterned on a layer of material, such as a layer of conductive material (e.g., NiFe). FIG. 1 is a cross-sectional view of a wafer with a photoresist 106 formed on a conductive layer 102. Photoresist 106 is shown having a bi-layer structure just for illustrative purposes, as photoresist 106 may be formed from a single layer of material or multiple layers of material. With photoresist 106 patterned in the desired manner, one or more thin-films are deposited on wafer. In this example, assume that a layer of insulation material, such as alumina, is deposited on the wafer. FIG. 2 is a cross-sectional view of the wafer with an insulation layer 202 deposited. When deposited, insulation layer 202 covers photoresist 106 and also covers the portions of conductive layer 102 that are not covered by photoresist 106. After insulation layer 202 is deposited, photoresist 106 is removed (i.e., dissolved) with an appropriate lift-off solution. FIG. 3 is a cross-sectional view of the wafer with photoresist 106 removed. When photoresist 106 is removed, the portion of insulation layer 202 that was deposited on top of photoresist 106 is also removed. This results in a hole 302 formed through insulation layer 202. The hole 302 extends cleanly into the top surface of conductive layer 102. Thus, if a second conductive layer is deposited on the wafer, the second conductive layer will contact the top surface of conductive layer 102 creating a good electrical connection.

Figure 4:
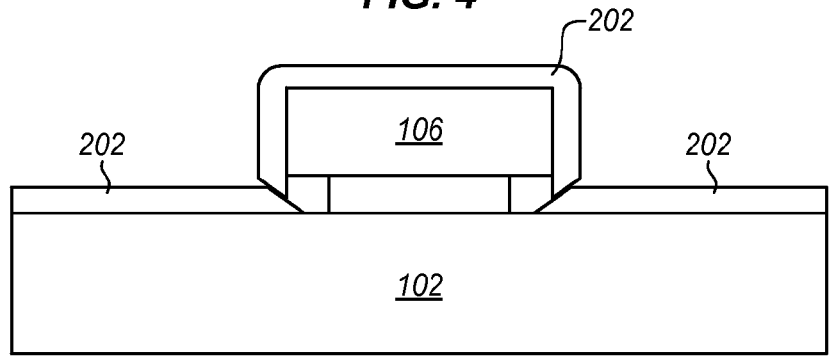
FIG. 4 is another cross-sectional view of the wafer with the insulation layer deposited on the photoresist.

It is a problem in wafer fabrication when the lift-off process does not result in a clean hole as shown in FIG. 3, but results in a poor hole that does not allow for a good electrical connection between two conductive layers. There may be many causes of poorly-formed holes from a lift-off process. For instance, if insulation layer 202 as in FIG. 2 is deposited too thick or photoresist 106 is too thin, then the insulation layer 202 on top of the photoresist 106 may not be removed. FIG. 4 is another cross-sectional view of the wafer with insulation layer 202 deposited on photoresist 106. In this example, insulation layer 202 is thicker than in FIG. 2 so that the portion of insulation layer 202 deposited on photoresist 106 covers the sides of photoresist 106 and actually touches the portion of insulation layer 202 deposited on top of conductive layer 102. When these portions of insulation layer 202 touch in this manner, the lift-off solution will not be able to reach photoresist 106 in order to dissolve photoresist 106 wholly or even partially. Thus, if the lift-off solution is not able to dissolve photoresist 106, the portion of insulation layer 202 deposited on top of photoresist 106 will not be removed and a hole in insulation layer 202 will not be created.

Figure 5:
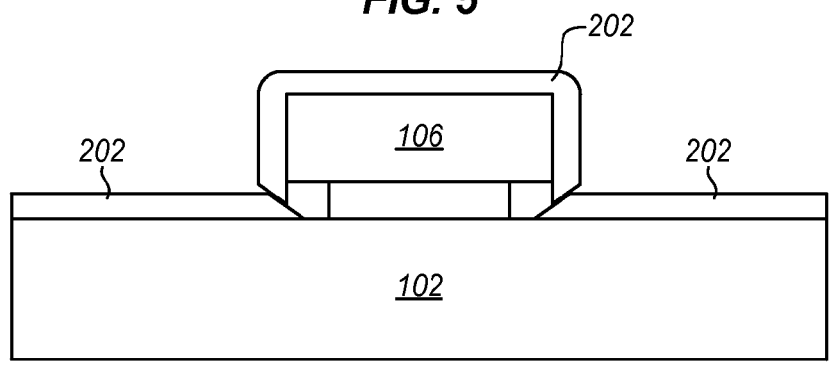
FIG. 5 is a cross-sectional view of the wafer after a lift-off solution has been applied to the wafer.
Figure 6:
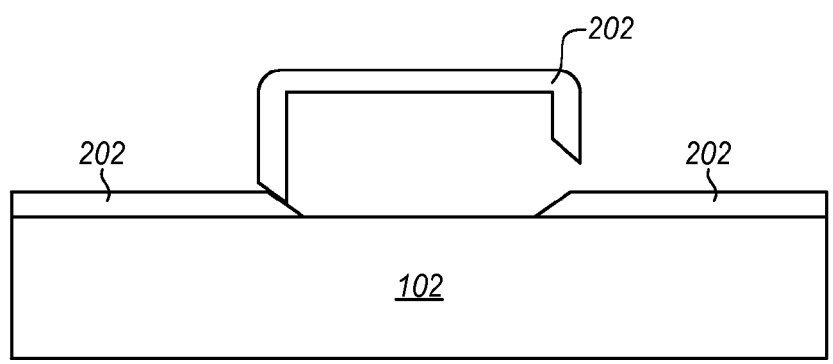
FIG. 6 is another cross-sectional view of the wafer after the lift-off solution has been applied to the wafer.

FIG. 5 is a cross-sectional view of the wafer after the lift-off solution has been applied to the wafer. In the example of FIG. 5, the lift-off solution is not able to dissolve any of photoresist 106, so the portion of insulation layer 202 deposited on top of photoresist 106 is not removed at all. Thus, no hole is formed in insulation layer 202 meaning that the lift-off process failed. FIG. 6 is another cross-sectional view of the wafer after the lift-off solution has been applied to the wafer. In the example of FIG. 6, the lift-off solution was able to dissolve photoresist 106, but insulation layer 202 was crowned over photoresist 106 in a manner that it was not washed away. This crowned portion of insulation layer 202 will block any subsequently deposited conductive layer from contacting the top surface of conductive layer 102. Thus, a poorly-formed hole is formed in insulation layer 202 meaning that the lift-off process failed.

If the lift-off process resulted in poorly-formed holes as illustrated in FIGS. 5-6, a conventional visual inspection of the wafer may not identify the poorly-formed holes. Thus, there is no effective way of determining the quality of the lift-off process. The following embodiments illustrate an improved way of electrically testing the holes created by the lift-off process in order to determine the quality of the lift-off process.

FIGS. 7-20 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 7:
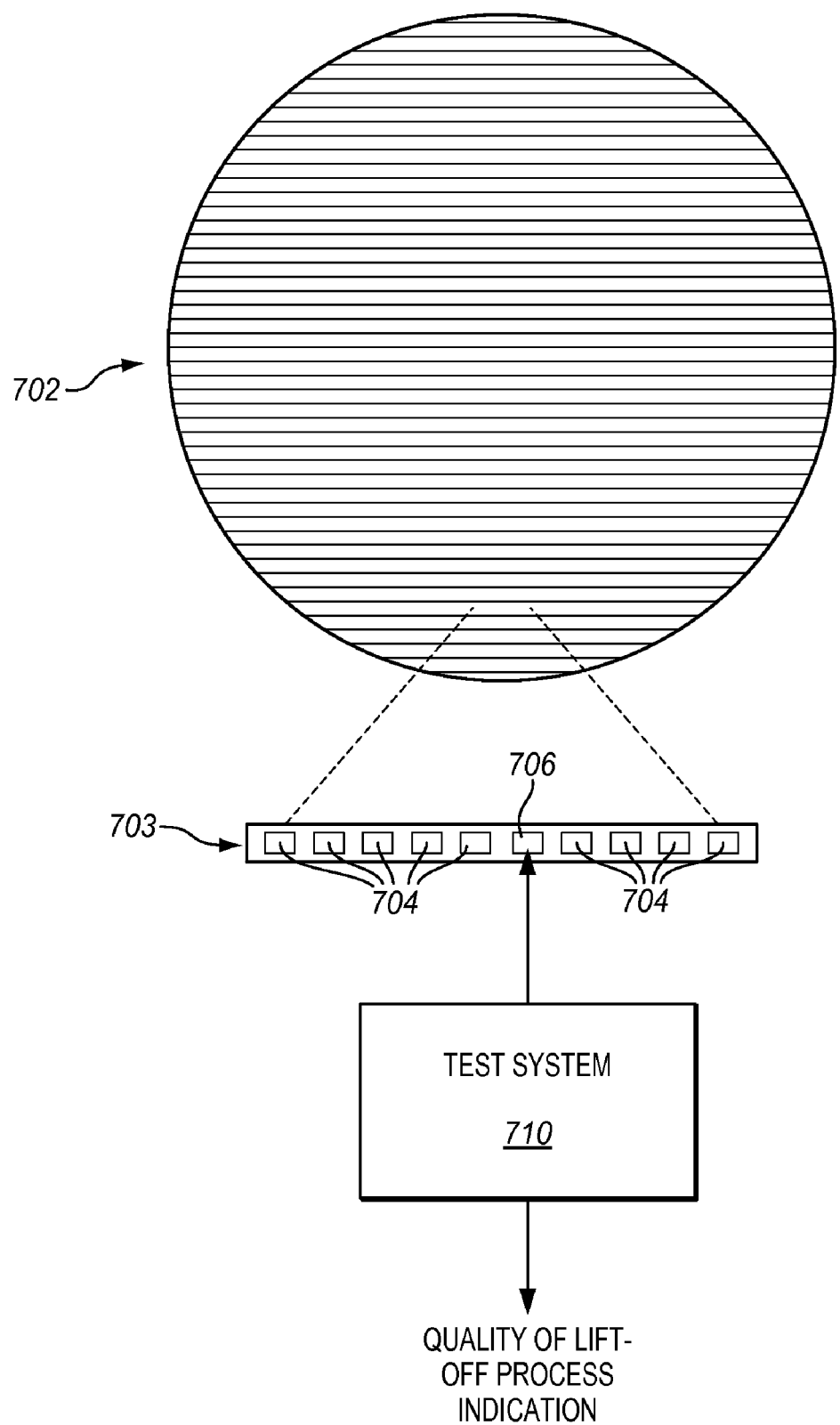
FIG. 7 illustrates a wafer in an exemplary embodiment of the invention.

FIG. 7 illustrates a wafer 702 in an exemplary embodiment of the invention. Wafer 702 comprises a plurality of rows of components, which are illustrated by the horizontal lines across wafer 702. Reference number 703 illustrates a magnified view of a portion of a row on wafer 702. This row on wafer 702 includes a plurality of functional components 704 and one or more test components 706. A functional component comprises a component that is fabricated to be ultimately used, sold, etc. Examples of a functional component include magnetic recording devices, such as MR recording heads, or semiconductor devices, such as amplifiers, transistors, etc. During fabrication of functional components 704, assume that one or more photolithography lift-off processes are performed.

A test component comprises a component fabricated on the wafer in order to determine the quality of the lift-off process used to fabricate functional components 704. Although one test component 706 is illustrated in FIG. 7, wafer 702 may be populated with multiple test components 706. Test components 706 may be staggered throughout wafer 702 in order to provide a sampling of the lift-off process in different positions on wafer 702. Test component 706 is configured so that a test system 710 is able to perform measurements to determine the quality of the lift-off process.

Figure 8:
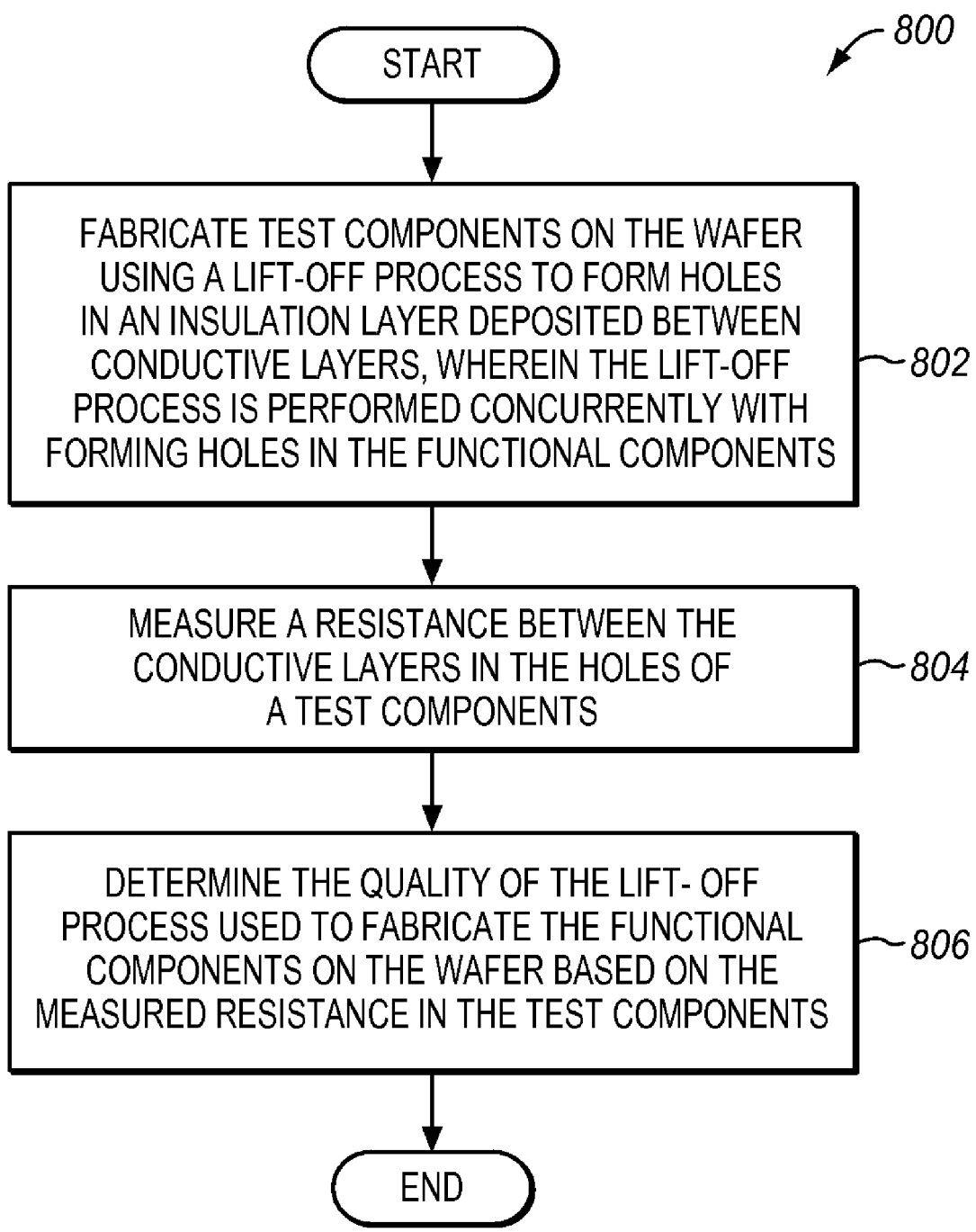
FIG. 8 is a flow chart illustrating a method of determining the quality of a lift-off process in an exemplary embodiment of the invention.

FIG. 8 is a flow chart illustrating a method 800 of determining the quality of the lift-off process in an exemplary embodiment of the invention. The steps of the flow chart in FIG. 8 are not all inclusive and may include other steps not shown.

Step 802 comprises fabricating one or more test components 706 on a wafer 702 along with the functional components 704 (see FIG. 7). When test components 706 are fabricated on wafer 702, a lift-off process is performed to define one or more holes in an insulation layer that is deposited between conductive layers in test components 706. For instance, assume that a first conductive layer is deposited, and the lift-off process is performed to define the holes through the insulation layer that is subsequently deposited. The holes formed by the lift-off process are then filled with conductive material of a second conductive layer. An exemplary lift-off process that forms a hole through an insulation layer was illustrated in FIGS. 1-3. A further description of an exemplary test component is shown in FIGS. 9-20 to help better understand its structure. One assumption is that the lift-off process used to form holes in test component 706 is the same or a similar lift-off process that is used to concurrently form holes in functional components 704. The lift-off process performed in test component 706 may form smaller holes than those formed in functional components 704 so as to give a better warning of process degradation.

Step 804 comprises measuring a resistance between the conductive layers in the holes of the test components 706, such as with test system 710. Test system 710 may include a four-point probe and associated processing capabilities that is able to measure a resistance. If a clean hole is formed, such as in FIG. 3, then the conductive layers will be in electrical contact through the holes creating a good electrical connection. The resistance between the conductive layers through the holes should be near 0 ohms. Conversely, if a hole is poorly-formed, such as in FIGS. 5-6, then the conductive layers will not have clean electrical contact through the holes. The resistance between the conductive layers through the holes will be a much higher value, maybe even approaching an open circuit. Thus, the resistance between the conductive layers through the holes indicates the quality of the holes formed by the lift-off process.

Step 806 comprises determining the quality of the lift-off process used to fabricate functional components 704 based on the measured resistance in test components 706, such as with test system 710. If the measured resistance is above a threshold resistance (which may be defined by a quality control administrator), then this indicates that holes fabricated in test component 706 were poorly formed. Similarly, if the measured resistance is below the threshold resistance, then this indicates that holes fabricated in test component 706 were properly formed. The assumption is that if the holes fabricated in test component 706 from the lift-off process are properly formed, then the lift-off process used to form holes in functional components 704 is at an acceptable quality level. Test system 710 may then indicate, such as to a quality control administrator, that the quality of the lift-off process is at an acceptable level. If the holes fabricated in test component 706 from the lift-off process are poorly formed, then the lift-off process used to form holes in functional components 704 is not at an acceptable quality level. Test system 710 may then indicate that the quality of the lift-off process is not at an acceptable level, and changes should be made to the lift-off process.

Figure 9:
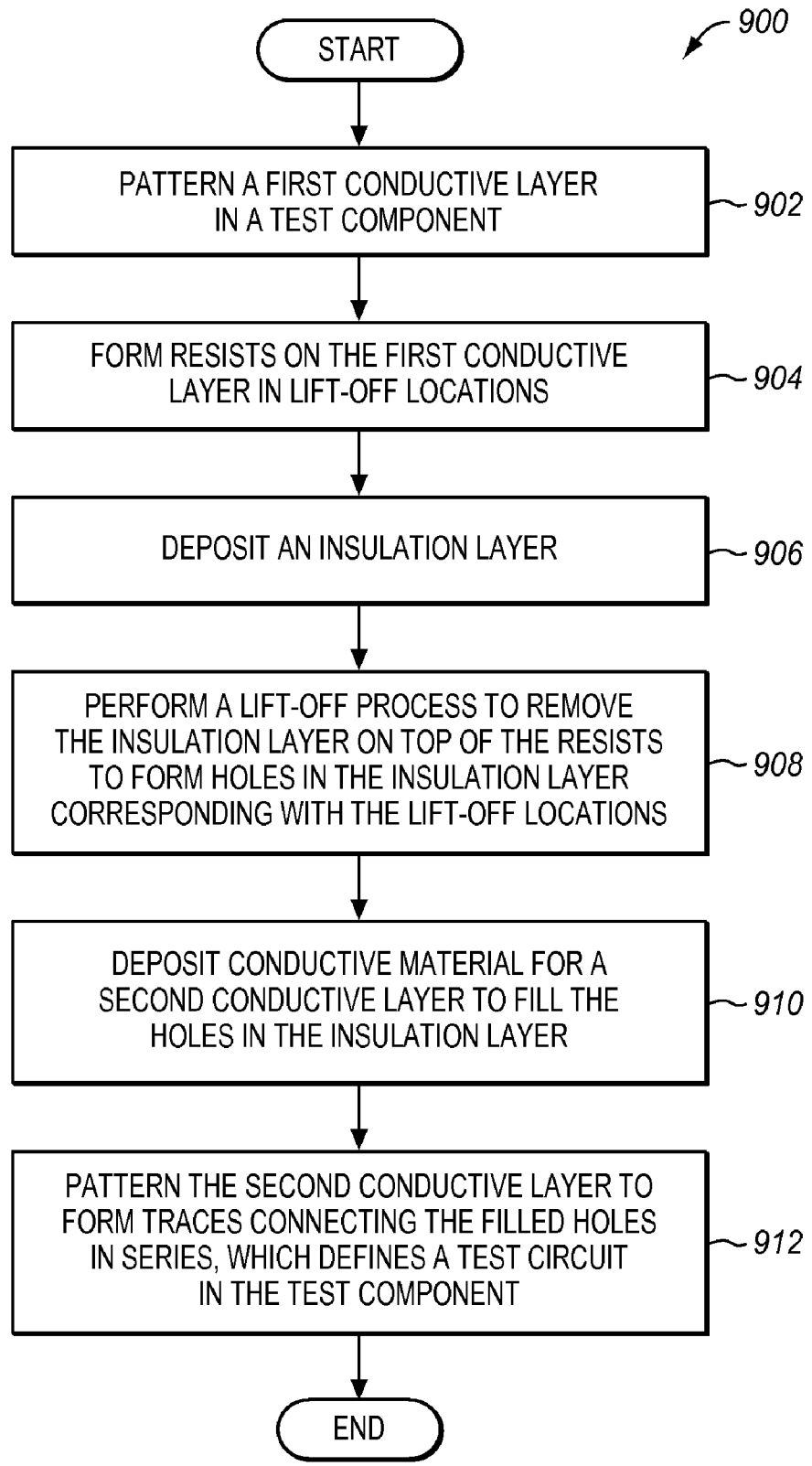
FIG. 9 is a flow chart illustrating a method of fabricating test components in an exemplary embodiment of the invention.

FIG. 9 is a flow chart illustrating a method 900 of fabricating test components, such as test component 706, in an exemplary embodiment of the invention. FIGS. 10-20 illustrate the results of the fabrication steps of method 900 in exemplary embodiments of the invention. The steps of the flow chart in FIG. 9 are not all inclusive and may include other steps not shown.

Figure 10:
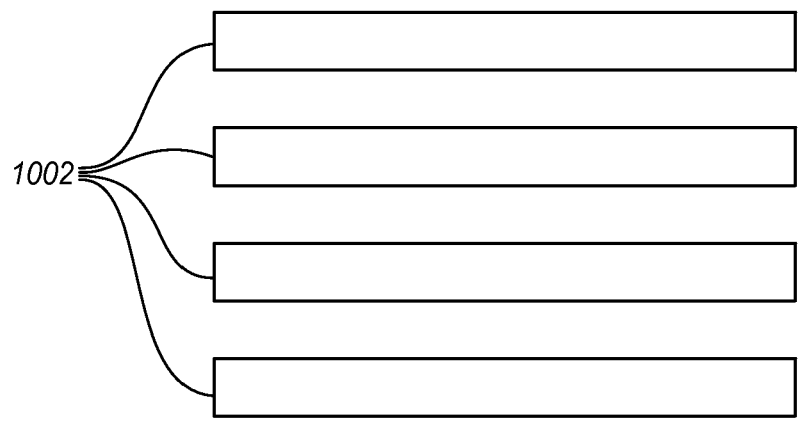
FIG. 10 is a top view of a wafer with a first conductive layer formed according to the method of FIG. 9 in an exemplary embodiment of the invention.
Figure 11:
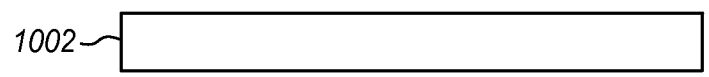
FIG. 11 is a cross-sectional view of the first conductive layer formed according to the method of FIG. 9 in an exemplary embodiment of the invention.

Step 902 comprises patterning a first conductive layer 1002 in a test component 706. FIG. 10 is a top view of wafer 702 with conductive layer 1002 formed according to step 902. Conductive layer 1002 is formed from any desired electrically conductive material, such as NiFe or Cu. Conductive layer 1002 as patterned in FIG. 10 comprises four parallel bars. Conductive layer 1002 may have many different patterns, as this is just one example. FIG. 11 is a cross-sectional view of the conductive layer 1002.

Figure 12:
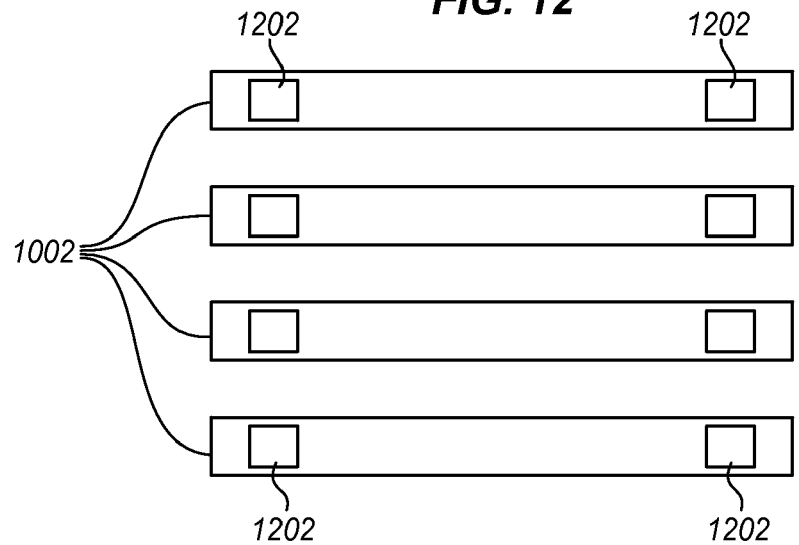
FIG. 12 is a top view of the wafer with resists formed according to the method of FIG. 9 in an exemplary embodiment of the invention.
Figure 13:
FIG. 13 is a cross-sectional view of the resists formed on the first conductive layer according to the method of FIG. 9 in an exemplary embodiment of the invention.

Step 904 comprises forming resists 1202 (i.e., photoresists) on conductive layer 1002 in lift-off locations. FIG. 12 is a top view of wafer 702 with resists 1202 formed according to step 904. The lift-off locations are the locations where holes will be formed by a lift-off process. The lift-off locations in this embodiment are on either end of each parallel bar of conductive layer 1002, although the lift-off locations may be in other desired areas. FIG. 13 is a cross-sectional view of resists 1202 formed on conductive layer 1002.

Figure 14:
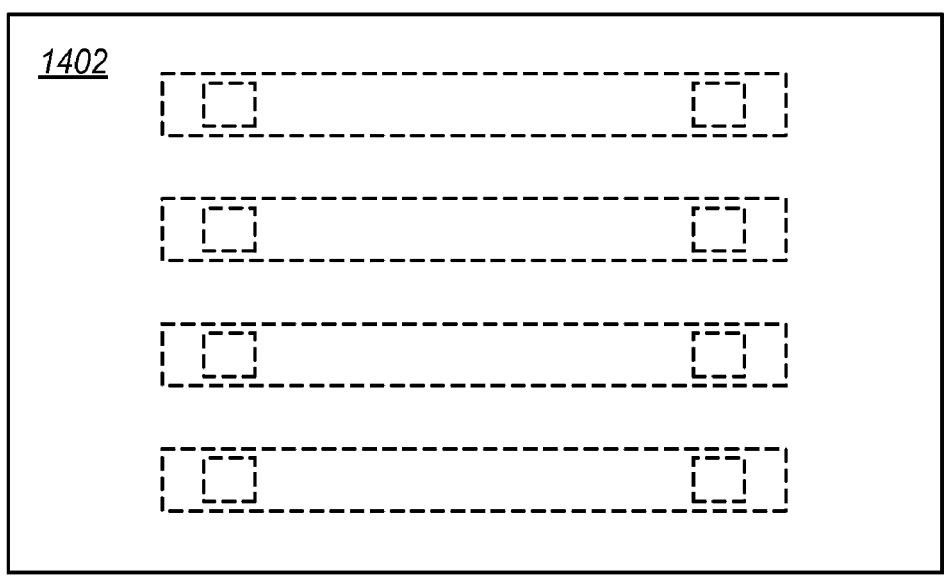
FIG. 14 is a top view of the wafer with an insulation layer formed according to the method of FIG. 9 in an exemplary embodiment of the invention.
Figure 15:
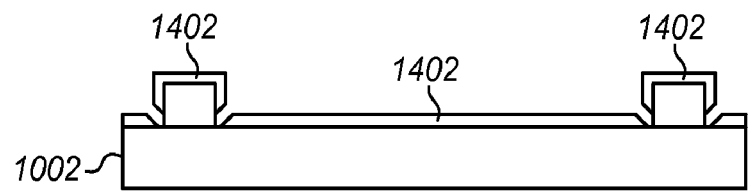
FIG. 15 is a cross-sectional view of the insulation layer formed according to the method of FIG. 9 in an exemplary embodiment of the invention.

Step 906 comprises depositing an insulation layer 1402 on wafer 702. FIG. 14 is a top view of wafer 702 with insulation layer 1402 formed according to step 906. Insulation layer 1402 is formed from a material that is not electrically conductive, such as alumina, which acts as insulation between two conductive layers. Insulation layer 1402 is deposited full-film so that it covers resists 1202, covers the exposed portions of conductive layer 1002, and also covers the other portions of wafer 702. Resists 1202 and conductive layer 1002 are illustrated as dotted lines in FIG. 14 to illustrate their locations underneath insulation layer 1402. FIG. 15 is a cross-sectional view of insulation layer 1402 formed on wafer 702.

Figure 16:
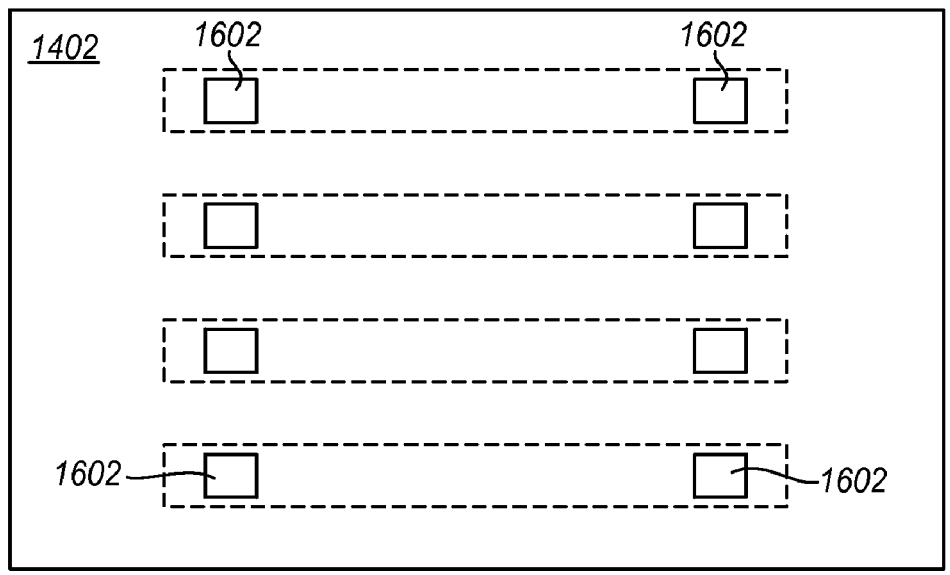
FIG. 16 is a top view of the wafer after a lift-off process is performed according to the method of FIG. 9 in an exemplary embodiment of the invention.
Figure 17:
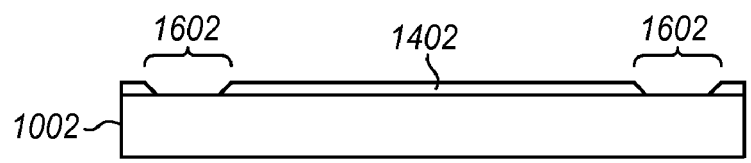
FIG. 17 is a cross-sectional view of the wafer after the lift-off process according to the method of FIG. 9 in an exemplary embodiment of the invention.

Step 908 comprises performing a lift-off process to remove insulation layer 1402 on top of resists 1202 to form holes 1602 in insulation layer 1402 corresponding with the lift-off locations. FIG. 16 is a top view of wafer 702 after the lift-off process is performed according to step 908. The lift-off process dissolves the resists 1202 underneath insulation layer 1402. The portions of insulation layer 1402 that were deposited on top of resists 1202 are thus washed away leaving holes 1602. Conductive layer 1002 is exposed through holes 1602. FIG. 17 is a cross-sectional view of wafer 702 after the lift-off process.

Figure 18:
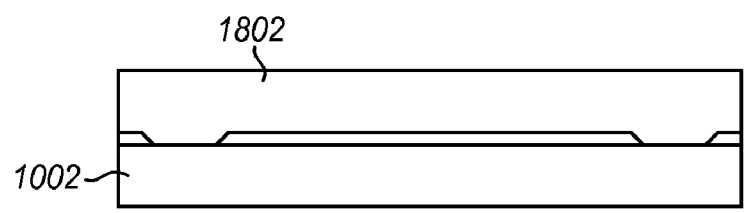
FIG. 18 is a cross-sectional view of the wafer with a second conductive layer formed according to the method of FIG. 9 in an exemplary embodiment of the invention.

Step 910 comprises depositing conductive material for a second conductive layer 1802 to fill holes 1602 in insulation layer 1402. FIG. 18 is a cross-sectional view of wafer 702 with conductive layer 1802 formed according to step 910. Conductive layer 1802 fills the holes 1602 formed in the lift-off process and contacts the top surface of conductive layer 1002. This forms an electrical connection between conductive layer 1802 and conductive layer 1002 (assuming that holes 1602 are properly formed).

Figure 19:
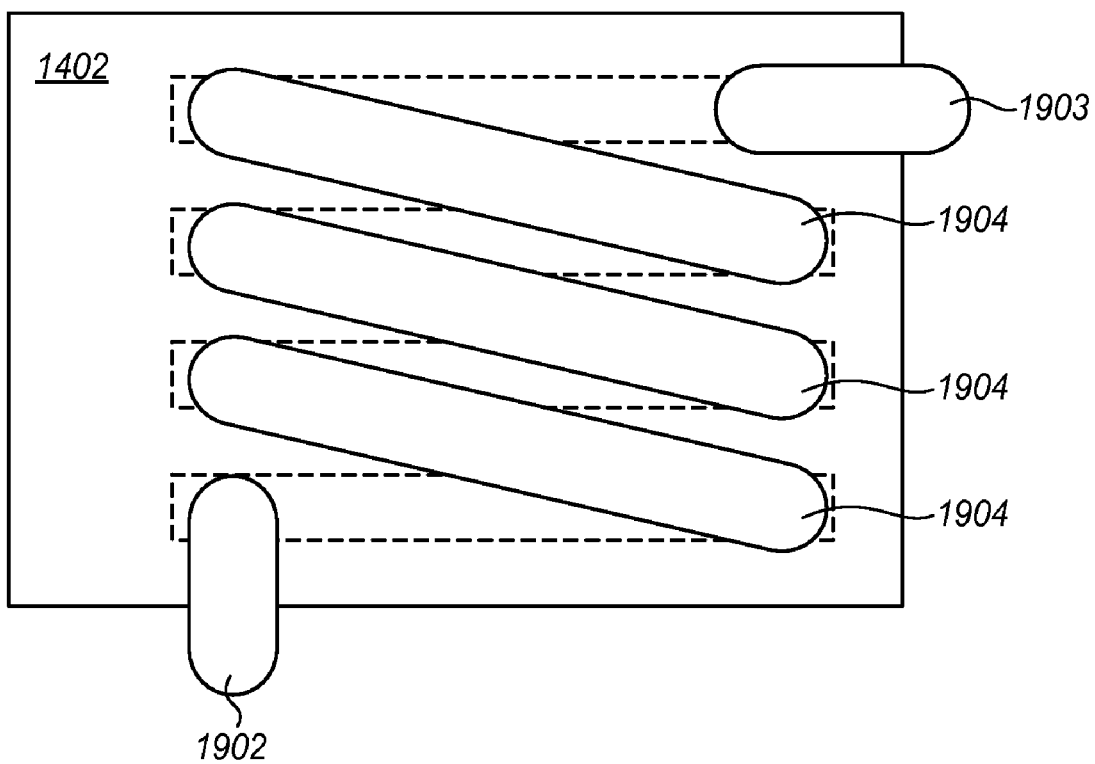
FIG. 19 is a top view of the wafer with the second conductive layer patterned according to the method of FIG. 9 in an exemplary embodiment of the invention.
Figure 20:
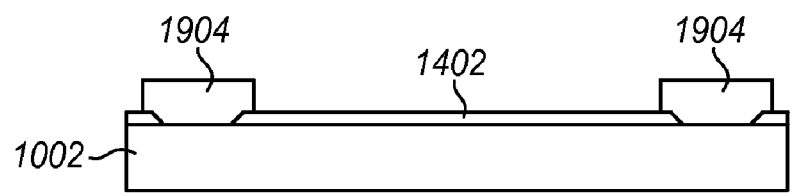
FIG. 20 is a cross-sectional view of the second conductive layer patterned according to the method of FIG. 9 in an exemplary embodiment of the invention.

Step 912 comprises patterning conductive layer 1802 to form traces connecting the filled holes 1602 in series. Connecting the filled holes 1602 in series defines a test circuit in test component 706. FIG. 19 is a top view of wafer 702 with conductive layer 1802 patterned according to step 912. Traces 1902-1903 represent test pads that may be contacted by a test system, such as test system 710 in FIG. 7, or by a probe system, such as a four-point probe. Traces 1904 connect one parallel bar of conductive layer 1002 to another parallel bar to form the series circuit. Traces 1904 may connect the parallel bars of conductive layer 1002 in many desired ways to form a series circuit, as FIG. 19 illustrates just one example. FIG. 20 is a cross-sectional view of conductive layer 1802 patterned on wafer 702.

With test component 706 formed as illustrated in FIG. 19, assume that a four-point probe is attached to test pads 1902-1903. The four-point probe will measure the resistance of the test circuit defined in test component 706. One assumption is that the resistance of conductive layer 1002 and traces 1904 of conductive layer 1802 is very low, such as less than a few ohms. Any significant resistance found in the test circuit will be the result of one or more poorly formed holes 1602 in insulation layer 1402 (see FIGS. 16-17). Thus, if a resistance is measured in the test circuit that is higher than some threshold resistance, then this is an indication that one or more holes 1602 were poorly formed in the lift-off process. The threshold resistance may depend on many factors, such as the number of traces 1904 used to define the size of the test circuit.

Further, the lift-off process used to form the holes 1602 in test component 706 is the same or similar process that is used to form holes in functional components 704 in wafer 702. If the measurement of test component 706 is above the threshold resistance and indicates that one or more holes were poorly formed in test component 706, then it follows that the quality of the lift-off process used to fabricate functional components 704 is below an acceptable level and should be adjusted. Fabricating test components 706 in wafer 702 as described herein advantageously allows wafer fabricators to electrically test the quality of lift-off processes instead of relying on visual inspections. The electrical testing is more accurate and more efficient than the visual inspections presently performed. Fabricators may use such an electrical testing technique to monitor fabrication processes or as a development tool to refine fabrication processes.

Although specific embodiments were described herein, the scope of the invention is not limited to those specific embodiments. The scope of the invention is defined by the following claims and any equivalents thereof.

We claim:

1. A method of testing the quality of a lift-off process used to fabricate functional components on a wafer, the method comprising:
    fabricating a plurality of test components on the wafer using the lift-off process to form holes in an insulation layer that is deposited on a first conductive layer and under a second conductive layer so that the second conductive layer fills the holes, wherein the lift-off process is performed concurrently with forming holes in the functional components;
    measuring a resistance between the first and second conductive layers in the holes of the test components; and
    determining the quality of the lift-off process used to fabricate the functional components on the wafer based on the measured resistance in the test components.

2. The method of claim 1 further comprising:
    indicating that the quality of the lift-off process is at an acceptable level responsive to the measured resistance being less than a threshold resistance.

3. The method of claim 2 further comprising:
    indicating that the quality of the lift-off process is below an acceptable level responsive to the measured resistance being greater than the threshold resistance.

4. The method of claim 1 wherein fabricating a plurality of test components on the wafer using the lift-off process comprises:
    patterning the first conductive layer in a test component;
    forming resists on the first conductive layer corresponding with the locations of the holes in the test component;
    depositing the insulation layer;
    performing the lift-off process to remove the insulation layer on top of the resists to form the holes in the insulation layer that expose a portion of a surface of the first conductive layer; and
    depositing conductive material for the second conductive layer to fill the holes in the insulation layer.

5. The method of claim 4 further comprising:
    patterning the second conductive layer to form traces connecting the filled holes in the test component in series, which defines a test circuit in the test component.

6. The method of claim 5 wherein measuring a resistance between the first and second conductive layers in the holes of the test components comprises:
    measuring a resistance of the test circuit.

7. The method of claim 1 wherein the functional components comprise magnetic recording heads for reading from a magnetic recording media.

8. The method of claim 1 wherein the test components are staggered throughout the wafer.

9. A method of testing the quality of a lift-off process used to fabricate functional components on a wafer, the method comprising:
    fabricating a plurality of test components on the wafer along with the functional components, wherein the test components include at least one location where the lift-off process was performed to define a hole in an insulation layer that exposes a portion of a surface of a first conductive layer upon which the insulation layer was deposited, and where the hole was filled with conductive material of a second conductive layer which was deposited on the insulation layer;
    measuring a resistance between the first conductive layer and the second conductive layer in the hole of at least one of the test components; and
    determining the quality of the lift-off process used to fabricate the functional components on the wafer based on the measured resistance in the at least one test component.

10. The method of claim 9 further comprising:
    indicating that the quality of the lift-off process is at an acceptable level responsive to the measured resistance being less than a threshold resistance.

11. The method of claim 10 further comprising:
indicating that the quality of the lift-off process is below an acceptable level responsive to the measured resistance being greater than the threshold resistance.

12. The method of claim 9 wherein fabricating a plurality of test components on the wafer along with the functional components comprises:
patterning the first conductive layer in the at least one of the test components;
forming a resist on the first conductive layer corresponding with the location of the hole;
depositing the insulation layer;
performing the lift-off process to remove the insulation layer on top of the resist to form the hole in the insulation layer that exposes the portion of the surface of the first conductive layer; and
depositing the conductive material for the second conductive layer to fill the hole in the insulation layer.

13. The method of claim 12 wherein the lift-off process in the at least one test component forms a plurality of holes in the insulation layer to expose the portion of the surface of the first conductive layer, wherein the plurality of holes are filled with conductive material for the second conductive layer, and further comprising:
patterning the second conductive layer to form traces connecting the filled holes in the one test component in series, which defines a test circuit in the test component.

14. The method of claim 13 wherein measuring a resistance between the first conductive layer and the second conductive layer comprises:
measuring a resistance of the test circuit.

15. The method of claim 9 wherein the test components are staggered throughout the wafer.

16. A method of testing the quality of a lift-off process used to fabricate functional components on a wafer, the method comprising:
fabricating a plurality of test components on the wafer concurrently with the functional components by:
patterning a first conductive layer in a test component;
forming resists on the first conductive layer in lift-off locations;
depositing an insulation layer;
performing a lift-off process to remove the insulation layer on top of the resists to form holes in the insulation layer corresponding with the lift-off locations;
depositing conductive material for a second conductive layer to fill the holes in the insulation layer; and
patterning the second conductive layer to form traces connecting the filled holes in series, which defines a test circuit in the test component.

17. The method of claim 16 further comprising:
measuring a resistance of the test circuit; and
determining the quality of the lift-off process used to fabricate the functional components on the wafer based on the measured resistance of the test circuit.

18. The method of claim 17 further comprising:
indicating that the quality of the lift-off process is at an acceptable level responsive to the measured resistance being less than a threshold resistance.

19. The method of claim 18 further comprising:
indicating that the quality of the lift-off process is below an acceptable level responsive to the measured resistance being greater than the threshold resistance.

20. The method of claim 16 wherein the functional components comprise magnetic recording heads for reading from a magnetic recording media.

* * * * *